US006962845B2

United States Patent
Lee

(10) Patent No.: US 6,962,845 B2
(45) Date of Patent: Nov. 8, 2005

(54) METHOD FOR MANUFACTURING SEMICONDUCTOR CAPACITOR HAVING DOUBLE DIELECTRIC LAYER THEREIN

(75) Inventor: Kee-Jeung Lee, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 115 days.

(21) Appl. No.: 10/738,177

(22) Filed: Dec. 16, 2003

(65) Prior Publication Data

US 2004/0266126 A1 Dec. 30, 2004

(30) Foreign Application Priority Data

Jun. 30, 2003 (KR) .................... 10-2003-0043076

(51) Int. Cl.[7] .......................................... H01L 21/8242
(52) U.S. Cl. .................... 438/240; 438/253; 438/396; 438/244; 438/387
(58) Field of Search ..................... 438/239, 240, 438/243, 244, 253, 254, 386, 387, 396, 397

(56) References Cited

U.S. PATENT DOCUMENTS

| 6,653,186 | B2 * | 11/2003 | Won et al. ................... 438/253 |
| 6,664,186 | B1 * | 12/2003 | Callegari et al. ............ 438/681 |
| 6,670,256 | B2 * | 12/2003 | Yang et al. .................. 438/396 |
| 6,686,239 | B2 * | 2/2004 | Nam et al. ................... 438/244 |
| 6,753,618 | B2 * | 6/2004 | Basceri et al. .............. 257/296 |
| 2003/0052358 | A1 * | 3/2003 | Weimer ....................... 257/310 |
| 2004/0012043 | A1 * | 1/2004 | Gealy et al. ................ 257/303 |

* cited by examiner

*Primary Examiner*—Amir Zarabian
*Assistant Examiner*—Khanh Duong
(74) *Attorney, Agent, or Firm*—Blakely, Sokoloff, Taylor & Zafman

(57) ABSTRACT

The method for manufacturing a DRAM capacitor is employed to enhance charge capacitance and electrical endurance of the DRAM capacitor by structuring a double dielectric layer of aluminum oxide ($Al_2O_3$) and hafnium oxide ($HfO_2$). The method includes steps of: preparing an active matrix including a semiconductor substrate, an ILD formed on the semiconductor substrate and a storage node obtained after patterning the ILD into a predetermined configuration; forming a bottom electrode on top faces of the storage node and portions of the ILD; forming a diffusion barrier on an exposed surface of the bottom electrode; forming a double dielectric layer including an aluminum oxide layer and a hafnium oxide layer, wherein the aluminum oxide layer and the hafnium oxide layer are formed on the diffusion barrier in succession; carrying out an annealing process for recovering dielectric properties of the aluminum oxide layer and the hafnium oxide layer; and forming a top electrode on the hafnium oxide layer.

37 Claims, 5 Drawing Sheets

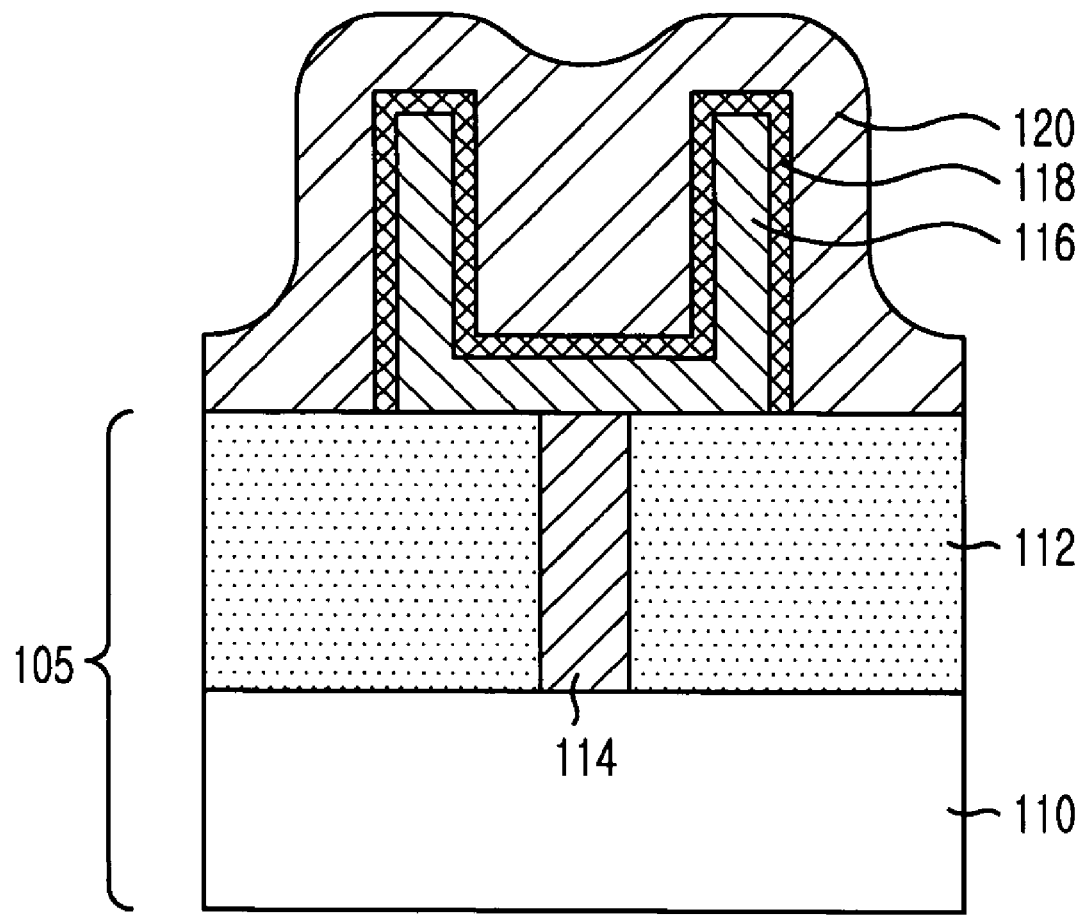

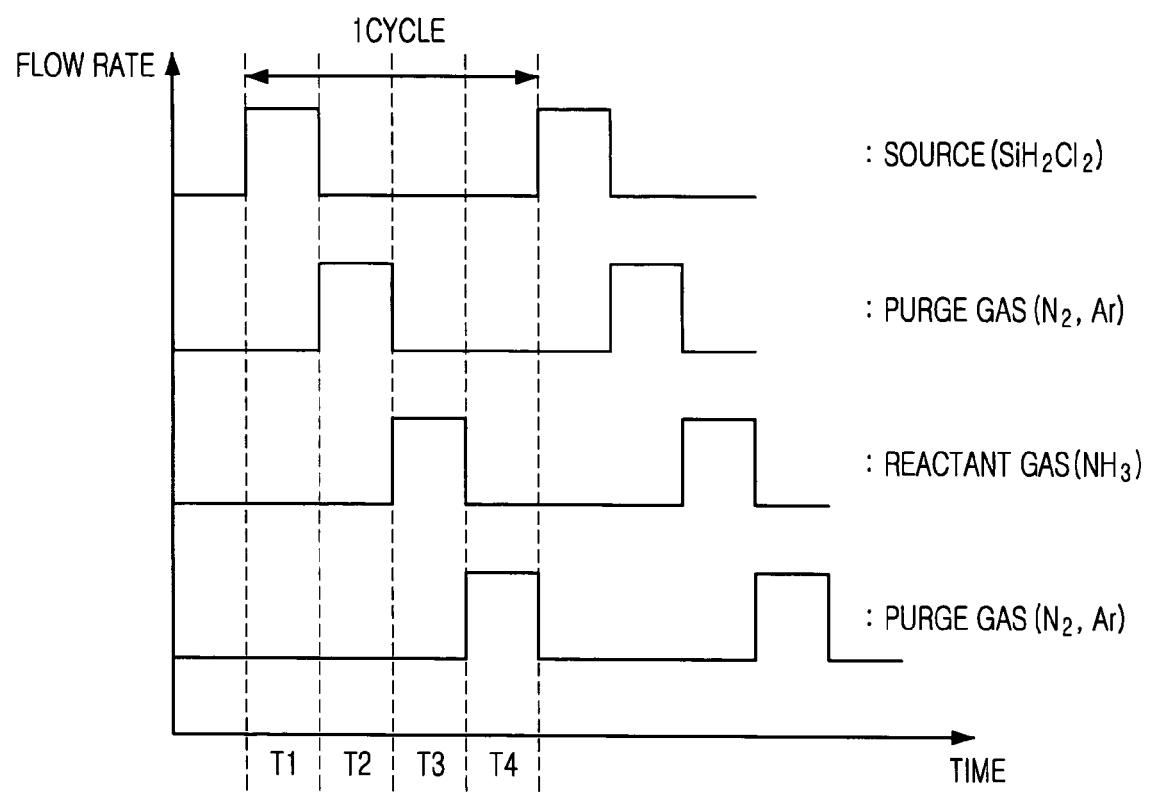

METHOD FOR MANUFACTURING SEMICONDUCTOR CAPACITOR HAVING DOUBLE DIELECTRIC LAYER THEREIN

FIELD OF THE INVENTION

The present invention relates to a method for manufacturing a semiconductor device; and, more particularly, to a method for manufacturing a dynamic random access memory (DRAM) capacitor having a double dielectric layer of aluminum oxide ($Al_2O_3$) and hafnium oxide ($HfO_2$) therein.

DESCRIPTION OF THE PRIOR ART

Recently, as a semiconductor device is highly integrated, research and development on the semiconductor device have been directed toward both reducing a cell area and lowering a device-operating voltage. Despite reduction of the cell area, a capacitance for operating a memory device is still demanded to be kept on the order of at least 25 fF per cell, which can prevent the memory device from generation of soft errors and decrease of a refresh time.

To meet the demand, therefore, there are several methods, such as a trench type or a stack type capacitor, which are arranged three-dimensionally in the memory device for reducing the cell area available to the desired capacitor. However, there is still a strong demand for a new memory device that can reduce the cell area and secures a requisite volume of information simultaneously.

Therefore, in manufacturing a conventional dynamic random access memory (DRAM) device having a nitride-oxide (NO) capacitor of which a dielectric material employs silicon nitride ($Si_3N_4$, $\in=7$), it has been typically necessary to utilize a storage electrode of three dimensional structure having hemispherical grains (HSGs) formed thereon due to its low dielectric constant. The three-dimensional electrode structure with the HSGs increases an effective surface area of the storage electrode for securing the capacitance. However, since the capacitor has a high vertical electrode structure, step coverage is inevitably deteriorated. Thus, it is difficult to reduce an equivalent oxide thickness (Tox) below 40 Å because of its low dielectric constant.

In addition, since the method described above has limitation in applications for 256 megabytes or greater future generation DRAMs to ensure the desired capacitance of the capacitor for small cell area, a new DRAM capacitor having a high k dielectric material therein has been proposed such as tantalum oxide ($Ta_2O_5$, $\in=25$), hafnium oxide ($HfO_2$, $\in=20\sim25$) or the like.

Referring to FIGS. 1A to 1C, there is shown cross sectional views setting forth a conventional method for manufacturing a DRAM capacitor having a single dielectric layer therein.

In FIG. 1A, the conventional method for manufacturing the DRAM capacitor begins with preparing an active matrix 105 including a semiconductor substrate 110, an interlayer dielectric (ILD) 112 and a storage node 114 obtained after patterning the ILD 112 into a predetermined configuration. The storage node 114 is electrically connected to a source/drain region embedded in the semiconductor substrate 110 which is not shown in drawings for the sake of convenience.

Thereafter, a bottom electrode 116 with a cylindrical structure is formed on top faces of the storage node 114 and portions of the ILD 112 by using an exemplary deposition technique. The bottom electrode 116 employs a predetermined conductive material, e.g., a polysilicon doped with an impurity such as phosphorous (P) or arsenic (As). Herein, the bottom electrode 116 can be a concave structure. Additionally, hemispherical grains (HSGs) may be formed on the bottom electrode 116 for increasing the effective surface area.

Following the formation of the bottom electrode 116, referring to FIG. 1B, a dielectric layer 118 is formed on exposed surface of the bottom electrode 116. The dielectric layer 118 is a single layer employing a material such as $Si_3N_4$, $Ta_2O_5$, $Al_2O_3$, $HfO_2$ or the like.

Finally, a top electrode 120 is formed on exposed surface of the dielectric layer 118 by using an exemplary deposition technique, wherein the top electrode 120 employs a predetermined conductive material such as iridium (Ir), platinum (Ir), tungsten (W) or the like. Thus, a conventional DRAM capacitor is achieved as shown in FIG. 1C.

As aforementioned, the conventional method for manufacturing the DRAM capacitor makes use of a single dielectric layer 118 of various dielectric materials so that there are induced several shortcomings.

First, in utilizing $Ta_2O_5$ as the dielectric layer 118 in the DRAM capacitor, there is a problem that the surface of the bottom electrode 116 is unavoidably oxidized during a post annealing process after depositing the dielectric layer 118 on the bottom electrode 116. Thus, the equivalent oxide thickness (Tox) becomes beyond about 30 Å. Additionally, there is also a drawback that leakage current of the capacitor increases owing to a deterioration of the dielectric layer 118 during high temperature annealing process for recovering a dielectric property.

Second, the DRAM capacitor having dielectric layer 118 of $Al_2O_3$ therein has a problem that it has a low dielectric constant so that it is not appropriate for securing the sufficient capacitance although the $Al_2O_3$ dielectric layer 118 has a good property of the breakdown strength and leakage current.

Third, the DRAM capacitor of $HfO_2$ dielectric layer 118 suffers from drawbacks that it has low breakdown strength so that the DRAM capacitor becomes vulnerable to electrical shock, whereby capacitor endurance is deteriorated in the long run.

Therefore, the conventional method for manufacturing the DRAM capacitor using a single dielectric layer 118 inevitably suffers from problems of low capacitance, increase of leakage current and poor electrical endurance, whereby a reliability of the memory device becomes deteriorated.

SUMMARY OF THE INVENTION

It is, therefore, an object of the present invention to provide a method for manufacturing a semiconductor capacitor having a double dielectric layer of aluminum oxide ($Al_2O_3$) and hafnium oxide ($HfO_2$), thereby enhancing a charge capacitance and a breakdown strength of the semiconductor capacitor.

In accordance with one aspect of the present invention, there is provided a method for manufacturing a semiconductor capacitor, the method including the steps of: a) preparing an active matrix including a semiconductor substrate, an ILD formed on the semiconductor substrate and a storage node obtained after patterning the ILD into a predetermined configuration; b) forming a bottom electrode on top faces of the storage node and portions of the ILD; c) forming a diffusion barrier on an exposed surface of the bottom electrode; d) forming a double dielectric layer including an aluminum oxide layer and a hafnium oxide layer, wherein the aluminum oxide layer and the hafnium oxide layer are formed on the diffusion barrier in succession; e) carrying out an annealing process for recovering dielectric properties of the aluminum oxide layer and the hafnium oxide layer; and f) forming a top electrode on the hafnium oxide layer.

BRIEF DESCRIPTION OF THE DRAWINGS

The above and other objects and features of the present invention will become apparent from the following description of the preferred embodiments given in conjunction with the accompanying drawings, in which:

FIGS. 1A to 1C are cross sectional views setting forth a conventional method for manufacturing a semiconductor capacitor having a single dielectric layer therein;

FIG. 3 is a graph illustrating a process mechanism for forming the diffusion barrier of silicon nitride by means of the ALD method in accordance with a preferred embodiment of the present invention.

DETAILED DESCRIPTION OF THE PREFERRED EMBODIMENTS

Figure 1A:
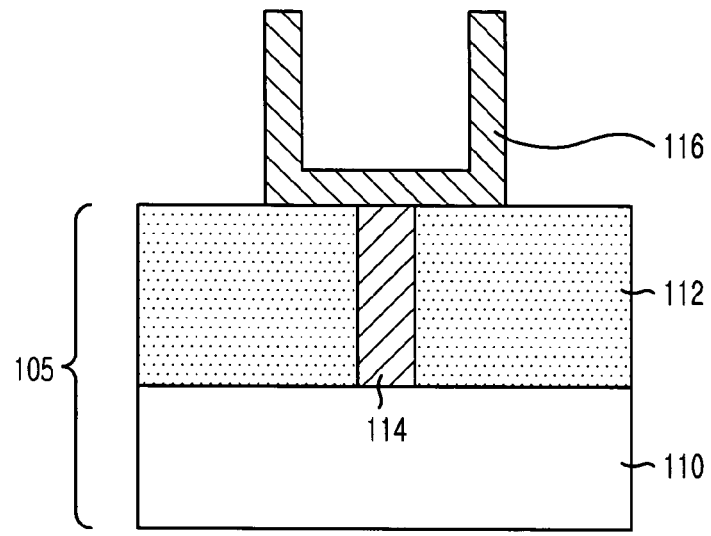
Figure 1B:
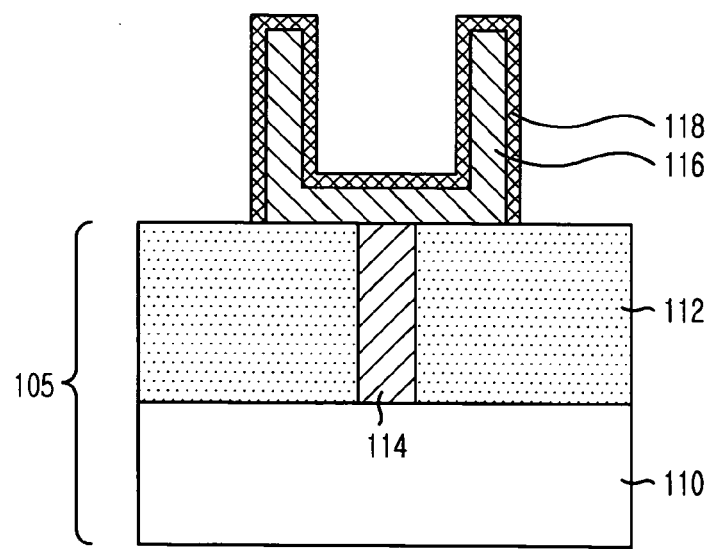

There are provided in FIGS. 2A to 2D cross sectional views setting forth a method for manufacturing a semiconductor capacitor in accordance with a preferred embodiment of the present invention. It should be noted that like parts appearing in FIGS. 2A to 2D are represented by like reference numerals.

Figure 2A:
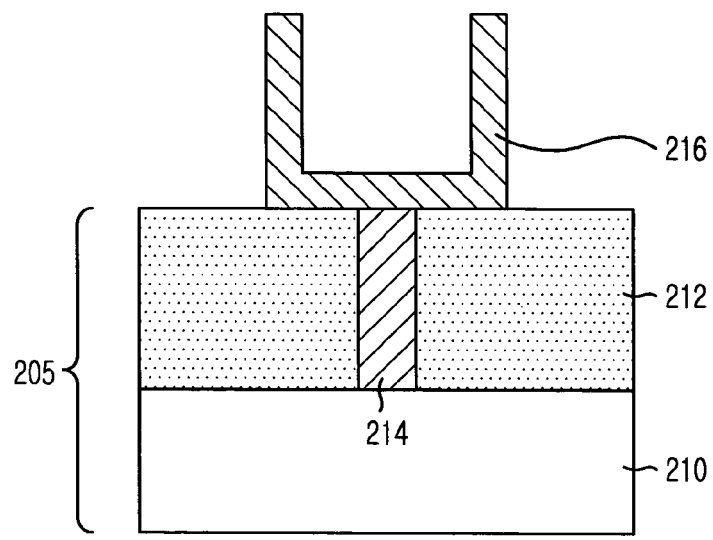
FIGS. 2A to 2D are cross sectional views setting forth a method for manufacturing a semiconductor capacitor having a double dielectric layer of aluminum oxide ($Al_2O_3$) and hafnium oxide ($HfO_2$) therein in accordance with a preferred embodiment of the present invention.

Referring to FIG. 2A, an inventive method for manufacturing a semiconductor capacitor begins with preparation of an active matrix 205 including a semiconductor substrate 210, an ILD 212 formed on a top face of the semiconductor substrate 210 and a storage node 214 obtained after patterning the ILD 212 into a predetermined configuration. Herein, the storage node 214 employs a doped polysilicon, wherein the storage node 214 is electrically connected to a source/drain region embedded in the semiconductor substrate 210, which is not shown for the sake of convenience.

Thereafter, a bottom electrode 216 is formed on a top face of the storage node 214 and portions of the ILD 212. The bottom electrode 216 employs a predetermined conductive material, e.g., a polysilicon doped with an impurity such as phosphorous (P) or arsenic (As). In addition, the bottom electrode 216 is formed by using a method such as a sputtering method, a chemical vapor deposition (CVD) method, an atomic layer deposition (ALD) method or the like. While the bottom electrode 216 has a cylindrical structure in the preferred embodiment of the present invention, it is possible to form the bottom electrode 216 with a concave structure. Also, hemispherical grains (HSGs) can be formed on exposed surface of the bottom electrode 216 for increasing an effective surface of the bottom electrode 216.

Subsequently, a pre-cleaning process is carried out for removing a native oxide, e.g., silicon oxide, on the surface of the bottom electrode 216 and for carrying out hydrogen termination process. The pre-cleaning process is performed by using a hydrogen fluoric (HF) acid diluted with water in a ratio ranging from about 10 to about 100. Alternatively, the pre-cleaning process can be carried out by using an HF acid diluted with ammonium fluoride ($NH_4F$) in a ratio ranging from about 5 to about 500. The diluted HF with water or $NH_4F$ has the advantage of dissolving the natural oxide of silicon oxide without attacking polysilicon, i.e., the bottom electrode 216.

Herein, before or after the pre-cleaning process, a supplementary cleaning process may be introduced in order to remove impurities again such as organic material, inorganic material or the like, which remains on the surface of the bottom electrode 216. The supplementary cleaning process can be carried out by making use of a mixed solution of $NH_4OH$, $H_2O_2$ and $H_2O$ or a mixed solution of $H_2SO_4$ and $H_2O_2$.

Figure 2B:
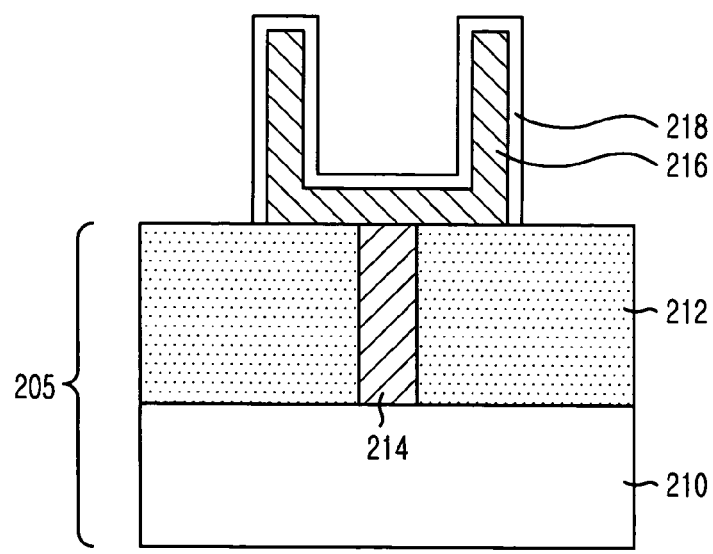

In a next step, referring to FIG. 2B, a diffusion barrier 218 is formed on an exposed surface of the bottom electrode 216 for prevent oxygen diffusion into the bottom electrode 216 by nitrifying the surface of the bottom electrode 216 or by depositing a predetermined material for use in the diffusion barrier 218 by means of an atomic layer deposition (ALD) method. Herein, the diffusion barrier 218 of the present invention employs silicon nitride (SiN). The process for forming the diffusion barrier 218 of the SiN layer is more illustrated in detail hereinafter.

A first process for forming the diffusion barrier 218 is carried out by nitrifying the surface of the bottom electrode 218 as aforementioned. That is, the first process is performed by annealing the bottom electrode 216 for about one minute to about 5 minutes making use of plasma in an ammonia ($NH_3$) gas chamber at a temperature ranging from about 200° C. to about 500° C., on condition that $NH_3$ gas is supplied into the chamber in a flow rate ranging from about 25 sccm (standard cubic centimeters) to about 250 sccm, a pressure ranges from about 0.1 torr to about 10 torr and an RF power is applied thereto in a range of about 100 W to about 500 W.

Alternatively, the first process for forming the diffusion barrier 218 through a nitrification process of the bottom electrode 216 can be carried out by annealing the bottom electrode 216 in a rapid thermal processing (RTP) chamber or an electrical furnace in $NH_3$ gas ambient, on condition that $NH_3$ gas is supplied into the chamber in the flow rate ranging from about 25 sccm to about 250 sccm, a temperature ranges from about 600° C. to about 800° C. and a pressure ranges from about 700 torr to about 760 torr or from about 1 torr to about 100 torr.

A second process for forming the diffusion barrier 218 of SiN is carried out by using the ALD method. The second process is carried out by using dichlorosilane (DCS, $SiH_2Cl_2$) gas as a silicon source and $NH_3$ gas as a reactant gas at a temperature ranging from about 550° C. to about 650° C.

Referring to FIG. 3, there is shown a graph setting forth a mechanism of the second process for depositing the diffusion barrier 218 of SiN by means of the ALD method in detail.

In FIG. 3, the second process for forming SiN layer begins with loading a semiconductor structure including the active matrix 205 and the bottom electrode 216 formed on the active matrix 205 prepared by a predetermined process. Subsequently, the DCS gas is supplied into the chamber for T1 time, whereby the DCS gas is absorbed on the surface of the bottom electrode 216. Then, a purge gas, e.g., an inert gas such as argon gas, nitrogen gas or the like, is supplied into the chamber for T2 time in order to remove DCS residues which are not reacted with the bottom electrode 216. Thereafter, a reactant gas such as $NH_3$ or the like is supplied into the chamber in order to render $NH_3$ gas to be reacted with an absorbed DCS gas for T3 time, thereby depositing an SiN atomic layer. Finally, the purge gas, e.g., inert gas such as argon gas, nitrogen gas or the like, is supplied into the chamber for T4 time in order to remove unreacted gas and by-products. The time during T1 to T4 is one cycle for depositing the SiN atomic layer. Thus, it is possible to form the SiN layer with desired thickness by repeating this cycle in case of using the ALD method.

Although the SiN layer can be formed by using a conventional low pressure CVD (LPCVD) method, the SiN layer formed by means of the LPCVD method has hydrogen content of about 75% in the SiN layer which is analyzed by a Fourier transform infrared spectrometer (FTIR) so that the quality of the SiN layer can not help but be deteriorated in comparison with the SiN layer achieved by means of the ALD method in accordance with the present invention.

Figure 2C:
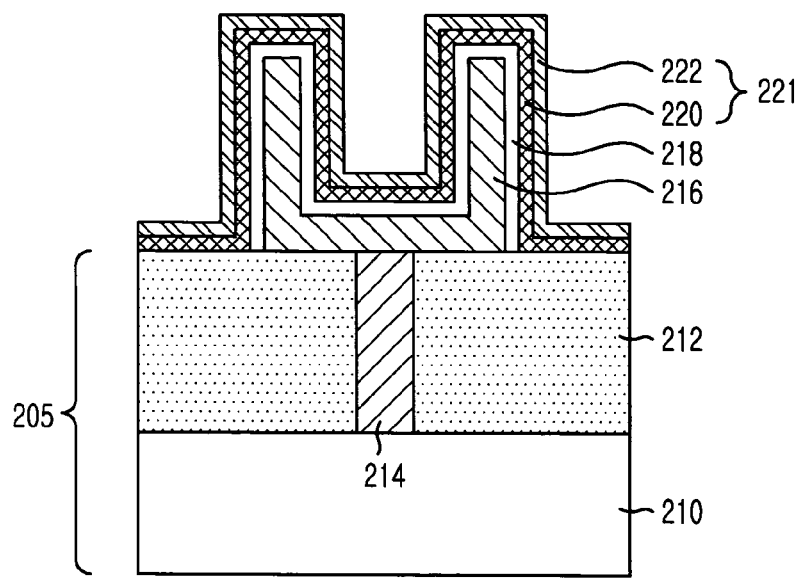

Following the formation of the diffusion barrier 218 of SiN, referring to FIG. 2C, an aluminum oxide ($Al_2O_3$) layer 220 and a hafnium oxide ($HfO_2$) layer 222 are formed on exposed surface of the diffusion barrier 218 by in-situ deposition or ex-situ deposition, thereby forming a double dielectric layer 221 with a high dielectric constant and an enhanced breakdown strength. The aluminum oxide layer 220 and the hafnium oxide layer 222 are deposited by using a method such as the ALD or the CVD method with uniform thickness. Herein, it is noted that a total thickness of the double dielectric layer 221 should not exceed in a range of about 30 Å to about 70 Å and a thickness ratio between the hafnium oxide layer 222 and the aluminum oxide layer 220 should range from about 1:0.5 to about 1:5. In addition, it is preferable that the aluminum oxide layer 220 should be deposited with the thickness at least 20 Å and the hafnium oxide layer 222 should be deposited with the thickness at least 10 Å.

In depositing the aluminum oxide layer 220, it is preferable to make use of an organic material containing aluminum such as aluminum trimethyl ($Al(CH_3)_3$) precursor, aluminum triethyl ($Al(OC_2H_5)_3$) precursor or the like as a source gas. In addition, it is preferable to utilize ozone ($O_3$) gas or oxygen ($O_2$) gas as a reactant gas. The formation of the aluminum oxide layer 220 is carried out on condition that the source gas is supplied thereto in the flow rate ranging from about 50 sccm to about 500 sccm, the flow rate of the reactant gas is in the range of about 0.1 sccm to about 1 sccm and a concentration of ozone gas is in the range of about 180 $g/m^3$ to about 220 $g/m^3$.

Additionally, in depositing the hafnium oxide layer 222, it is preferable to make use of hafnium tert-butoxide ($C_{16}H_{36}HfO_4$) precursor or an organic metallic compound precursor containing Hf therein such as a tetrakis-diethyl-amino-hafnium (TDEAHf), a tetrakis-ethyl-methyl-amino-hafnium (TEMAHf) or the like as a source gas. It is preferable to utilize $O_3$ gas or $O_2$ gas as a reactant gas. The formation of the hafnium oxide layer 222 is carried out on condition that the source gas is supplied thereto in the flow rate ranging from about 50 sccm to about 500 sccm, the flow rate of the reactant gas is in the range of about 0.1 sccm to about 1 sccm and a concentration of ozone gas is in the range of about 180 $g/m^3$ to about 220 $g/m^3$.

As described already, it is preferred to deposit the double dielectric layer 221 uniformly at the temperature ranging from about 250° C. to about 450° C. for restraining the formation of crystallites in the double dielectric layer 221. That is, amorphous state should be kept during the deposition process of the double dielectric layer 221. If not, it incurs serious shortcomings that a dielectric property is deteriorated, to thereby debase an electrical property of the double dielectric layer 221.

After forming the double dielectric layer 221, an annealing process is carried out in $N_2$ gas ambient containing $O_2$ gas less than 1 ppm for about 5 minutes to about 15 minutes in an electrical furnace in order to recover the dielectric property, on condition that the flow rate of $N_2$ gas is in the range of about 0.5 sccm to about 1 sccm and a temperature ranges about 600° C. to about 800° C. Alternatively, this annealing process can be carried out by means of the RTP for about 1 minute to about 3 minutes on condition that the flow rate of $N_2$ gas is in the range of about 0.5 sccm to about 1 sccm and a temperature ranges about 600° C. to about 800° C.

Figure 2D:
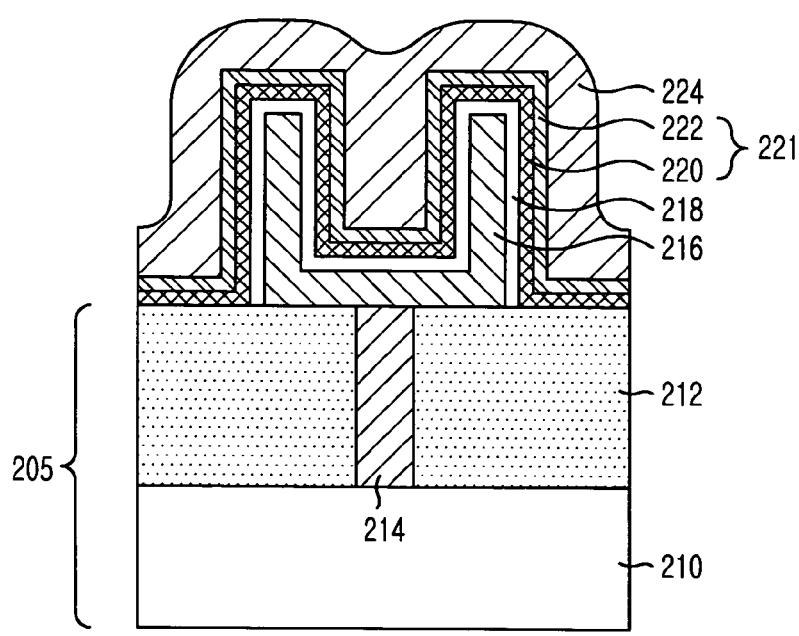

Following the annealing process, referring to FIG. 2D, a top electrode 224 is formed on exposed surface of the hafnium oxide layer 222, wherein the top electrode 224 employs a predetermined conductive material such as TiN, TaN, W, WN, Ru, $RuO_2$, Ir, $IrO_2$, Pt or the like. Therefore, the inventive semiconductor capacitor 200 is obtained.

In case of using a metallic material as the top electrode 224, it is preferable to form a protective layer (not shown) or a buffer layer (not shown) with the top electrode 224, which employs a material such as a doped polysilicon or silicon nitride, for protecting the top electrode 224 from moisture, temperature or electrical shock. Herein, the thickness of polysilicon or silicon nitride layer is preferably in the range about 200 Å to 1,000 Å.

In comparison with the prior art, the semiconductor capacitor in accordance with the present invention is achieved by forming the diffusion barrier 218 of SiN and the double dielectric layer 221 of the aluminum oxide layer 220 and the hafnium oxide layer 222, wherein the aluminum oxide layer 220 has good characteristics of breakdown strength and leakage current and the hafnium oxide layer 222 has a high dielectric constant enough to secure high capacitance of the semiconductor capacitor 200.

Even if the semiconductor capacitor has an equivalent oxide thickness (Tox) of less than 25 Å in accordance with the present invention, the semiconductor capacitor shows breakdown voltage above 2.0 V at an electrical current of 1 pA (pico-ampere)/cell, and also maintains leakage current below 0.5 fA (femto-ampere)/cell by virtue of the double dielectric layer of $AlO_3$ and $HfO_2$.

In addition, since the semiconductor capacitor in accordance with the present invention employs the SiN layer as the diffusion barrier 218, it is possible to prevent an interfacial reaction between the storage node 214 of polysilicon and the double dielectric layer 221, whereby the semiconductor capacitor shows a thermal stability during a post annealing process compared with prior art capacitor only having a single oxide layer such as $HfO_2$, $Al_2O_3$, $Ta_2O_5$ or the like as the dielectric layer. Therefore, it is possible to obtain the semiconductor capacitor with an enhanced electrical endurance and a high reliability.

While the present invention has been described with respect to the particular embodiments, it will be apparent to those skilled in the art that various changes and modifications may be made without departing from the scope of the invention as defined in the following claims.

What is claimed is:

1. A method for manufacturing a semiconductor capacitor, the method comprising the steps of:
   a) preparing an active matrix including a semiconductor substrate, an ILD formed on the semiconductor substrate and a storage node obtained after patterning the ILD into a predetermined configuration;
   b) forming a bottom electrode on top faces of the storage node and portions of the ILD;

c) forming a diffusion barrier on an exposed surface of the bottom electrode;

d) forming a double dielectric layer including an aluminum oxide layer and a hafnium oxide layer, wherein the aluminum oxide layer and the hafnium oxide layer are formed on the diffusion barrier in succession;

e) carrying out an annealing process for recovering dielectric properties of the aluminum oxide layer and the hafnium oxide layer; and f) forming a top electrode on the hafnium oxide layer.

2. The method as recited in claim 1, wherein the bottom electrode employs a polysilicon doped with an impurity material.

3. The method as recited in claim 2, wherein the impurity material is selected from the group consisting of phosphorous (P) and arsenic (As).

4. The method as recited in claim 1, wherein the diffusion barrier employs silicon nitride (SiN).

5. The method as recited in claim 4, wherein the step c) is carried out by nitrifying a surface of the bottom electrode.

6. The method as recited in claim 5, wherein the step c) is carried out by nitrifying the surface of the bottom electrode in an ammonia ($NH_3$) gas ambient chamber for about one minute to about 5 minutes, making use of plasma in which an RF power is applied thereto in a range of about 100 W to about 500 W.

7. The method as recited in claim 6, wherein the step c) is carried out by nitrifying a surface of the bottom electrode in an $NH_3$ gas ambient chamber on condition that ammonia gas is supplied into the chamber in a flow rate of about 25 sccm to about 250 sccm (standard cubic centimeters), a temperature ranges from about 200° C. to about 500° C. and a pressure ranges from about 0.1 torr to about 10 torr.

8. The method as recited in claim 5, wherein the step c) is carried out by nitrifying a surface of the bottom electrode in a rapid thermal process (RTP) chamber on condition that $NH_3$ gas is supplied into the RTP chamber in the flow rate of about 25 sccm to about 250 sccm, a temperature ranges from about 600° C. to about 800° C. and a pressure ranges from about 700 torr to about 760 torr.

9. The method as recited in claim 8, wherein the step c) is carried out by nitrifying a surface of the bottom electrode in the RTP chamber on condition that $NH_3$ gas is supplied into the RTP chamber in the flow rate of about 25 sccm to about 250 sccm, a temperature ranges from about 600° C. to about 800° C. and a pressure ranges from about 1 torr to about 100 torr.

10. The method as recited in claim 5, wherein the step c) is carried out by nitrifying a surface of the bottom electrode in the electrical furnace on condition that $NH_3$ gas is supplied into the electrical furnace in the flow rate of about 25 sccm to about 250 sccm, a temperature ranges from about 600° C. to about 800° C. and a pressure ranges from about 700 torr to about 760 torr.

11. The method as recited in claim 10, wherein the step c) is carried out by nitrifying a surface of the bottom electrode in the electrical furnace on condition that $NH_3$ gas is supplied into the electrical furnace in a flow rate of about 25 sccm to about 250 sccm, a temperature ranges from about 600° C. to about 800° C. and a pressure ranges from about 1 torr to about 100 torr.

12. The method as recited in claim 4, wherein the step c) is carried out by depositing SiN atomic layers on the bottom electrode by means of an atomic layer deposition (ALD) method.

13. The method as recited in claim 12, wherein the step c) is carried out at a temperature ranging from about 550° C. to about 650° C. making use of dichlorosilane (DCS, $SiH_2Cl_2$) gas as a silicon source and $NH_3$ gas as a reactant gas.

14. The method as recited in claim 1, wherein the step d) is carried out by in-situ deposition.

15. The method as recited in claim 1, wherein the step d) is carried out by ex-situ deposition.

16. The method as recited in claim 1, wherein the step d) is carried out on condition that a thickness ratio between the hafnium oxide layer and the aluminum oxide layer ranges from about 1:0.5 to about 1:5.

17. The method as recited in claim 16, wherein a thickness of the aluminum oxide layer is at least 20 Å and a thickness of the hafnium oxide layer is at least 10 Å.

18. The method as recited in claim 16, wherein a total thickness of the aluminum oxide layer and the hafnium oxide layer ranges about 30 Å to about 70 Å.

19. The method as recited in claim 1, wherein the aluminum oxide layer is formed by using an aluminum trimethyl ($Al(CH_3)_3$) precursor as a source gas and a reactant gas selected from the group consisting of $O_3$ gas and $O_2$ gas.

20. The method as recited in claim 1, wherein the aluminum oxide layer is formed by using an aluminum triethyl ($Al(OC_2H_5)_3$) precursor as a source gas and a reactant gas selected from the group consisting of $O_3$ gas and $O_2$ gas.

21. The method as recited in claim 1, wherein the hafnium oxide layer is formed by using a $C_{16}H_{36}HfO_4$ (Hafnium tert-butoxide) precursor as a source gas and a reactant gas selected from the group consisting of $O_3$ gas and $O_2$ gas.

22. The method as recited in claim 1, wherein the hafnium oxide layer is formed by using a tetrakis-diethyl-amino-hafnium (TDEAHf) precursor as a source gas and a reactant gas selected from the group consisting of $O_3$ gas and $O_2$ gas.

23. The method as recited in claim 1, wherein the hafnium oxide layer is formed by using a tetrakis-ethyl-methyl-amino-hafnium (TEMAHf) precursor as a source gas and a reactant gas selected from the group consisting of $O_3$ gas and $O_2$ gas.

24. The method as recited in claim 1, after the step b), further comprising the step of carrying out a pre-cleaning process for removing a natural oxide on the surface of the bottom electrode and carrying out a hydrogen terminating process.

25. The method as recited in claim 24, wherein the pre-cleaning process is carried out by using a diluted hydrofluoric (HF) acid.

26. The method as recited in claim 25, wherein the diluted HF acid is an HF acid diluted with water in a ratio ranging from about 10 to about 100.

27. The method as recited in claim 25, wherein the diluted HF acid is an HF acid diluted with ammonia fluoride ($NH_4F$) in a ratio ranging from about 5 to about 500.

28. The method as recited in claim 24, before carrying out the pre-cleaning process, further comprising a supplementary cleaning process for removing impurities on the surface of the bottom electrode by using a mixed solution of $NH_4OH$, $H_2O_2$ and $H_2O$.

29. The method as recited in claim 24, before carrying out the pre-cleaning process, further comprising a supplementary cleaning process for removing impurities on the surface of the bottom electrode by using a mixed solution of $H_2SO_4$ and $H_2O_2$.

30. The method as recited in claim 24, after carrying out the pre-cleaning process, further comprising a supplementary cleaning process for removing impurities on the surface of the bottom electrode by using a mixed solution of $NH_4OH$, $H_2O_2$ and $H_2O$.

31. The method as recited in claim 24, after carrying out the pre-cleaning process, further comprising a supplementary cleaning process for removing impurities on the surface of the bottom electrode by using a mixed solution of $H_2SO_4$ and $H_2O_2$.

32. The method as recited in claim 1, wherein the bottom electrode has a cylindrical structure.

33. The method as recited in claim 32, wherein the bottom electrode has the cylindrical structure having hemispherical grains (HSGs) thereon.

34. The method as recited in claim 1, wherein the bottom electrode has a concave structure.

35. The method as recited in claim 34, wherein the bottom electrode has the concave structure having the HSGs thereon.

36. The method as recited in claim 1, wherein the bottom electrode is formed by using a method selected from the group consisting of a sputtering method, a chemical vapor deposition (CVD) method and the ALD method.

37. The method as recited in claim 1, wherein the top electrode employs a material selected from the group consisting of titanium nitride (TiN), tantalum nitride (TaN), tungsten (W), tungsten nitride (WN), ruthenium (Ru), ruthenium oxide ($RuO_x$), iridium (Ir), iridium oxide ($IrO_x$) and platinum (Pt).

* * * * *